United States Patent
Rogojevic et al.

(10) Patent No.: US 7,498,603 B2
(45) Date of Patent: Mar. 3, 2009

(54) COLOR TUNABLE ILLUMINATION SOURCE AND METHOD FOR CONTROLLED ILLUMINATION

(75) Inventors: Svetlana Rogojevic, Niskayuna, NY (US); Michael Scott Herzog, Voorheesville, NY (US); Anil Raj Duggal, Niskayuna, NY (US); Jacob Charles Bortscheller, Clifton Park, NY (US); Tami Janene Faircloth, Santa Barbara, CA (US)

(73) Assignee: General Electric Company, Niskayuna, NY (US)

( * ) Notice: Subject to any disclaimer, the term of this patent is extended or adjusted under 35 U.S.C. 154(b) by 175 days.

(21) Appl. No.: 11/567,478

(22) Filed: Dec. 6, 2006

(65) Prior Publication Data

US 2008/0136337 A1    Jun. 12, 2008

(51) Int. Cl.
*H01L 35/24* (2006.01)
(52) U.S. Cl. .................. 257/40; 257/E51.001; 438/99
(58) Field of Classification Search .................. 257/40, 257/E51.001; 438/99
See application file for complete search history.

(56) References Cited

U.S. PATENT DOCUMENTS

| 4,801,844 | A | * | 1/1989 | Barrow et al. ............ 313/509 |
| 5,932,895 | A | | 8/1999 | Shen et al. |
| 5,965,907 | A | | 10/1999 | Huang et al. |
| 6,166,489 | A | | 12/2000 | Thompson et al. |
| 6,232,714 | B1 | | 5/2001 | Shen et al. |
| 6,242,076 | B1 | * | 6/2001 | Andriash .................. 428/138 |
| 6,693,296 | B1 | | 2/2004 | Tyan |
| 6,841,949 | B2 | | 1/2005 | Duggal |

(Continued)

FOREIGN PATENT DOCUMENTS

JP         10012380 A    1/1998

(Continued)

OTHER PUBLICATIONS

PCT International Search Report dated Jun. 5, 2008.

*Primary Examiner*—Wai-Sing Louie
(74) *Attorney, Agent, or Firm*—Mary Louise Gioeni (57) ABSTRACT

An illumination source including a first OLED layer capable of emitting light of a first color, a second OLED layer capable of emitting light of a second color and disposed on the first OLED layer, each of said first, second OLED layers including alternating active light-emitting areas and inactive non-light emitting areas; said first OLED layer comprising a first substrate, a first transparent electrode layer disposed on the substrate, a first electroluminescent layer capable of emitting light of the first color disposed on the first transparent electrode layer, and a first patterned metallized electrode layer forming the alternating active light-emitting areas and inactive non-light emitting areas; and said second OLED layer comprising a second substrate, a second transparent electrode layer disposed on the substrate, a second electroluminescent layer capable of emitting light of the second color disposed on the second transparent electrode layer, and a second patterned metallized electrode layer forming the alternating active light-emitting areas and inactive non-light emitting areas; wherein light emitted by the active light-emitting areas of the first OLED layer is transmitted through the inactive non-light emitting areas of the second OLED layer. A method for tuning color and/or intensity of the light output of an illumination source is also disclosed.

21 Claims, 6 Drawing Sheets

U.S. PATENT DOCUMENTS

| | | |
|---|---|---|
| 7,046,316 B2 | 5/2006 | Lai |
| 2004/0021425 A1 | 2/2004 | Foust et al. |
| 2004/0031957 A1 | 2/2004 | Tyan |
| 2004/0032205 A1 | 2/2004 | Hack et al. |
| 2005/0248524 A1 | 11/2005 | Feng et al. |
| 2005/0280359 A1 | 12/2005 | Liu et al. |
| 2006/0007099 A1 | 1/2006 | Oh et al. |
| 2006/0038770 A1 | 2/2006 | Burkholder |

FOREIGN PATENT DOCUMENTS

| | | |
|---|---|---|
| JP | 11329745 A | 11/1999 |
| JP | 2000036387 A | 2/2000 |
| JP | 2003036973 A | 2/2003 |
| WO | WO9633516 A1 | 10/1996 |
| WO | WO 2005/086257 A1 | 9/2005 |

\* cited by examiner

COLOR TUNABLE ILLUMINATION SOURCE AND METHOD FOR CONTROLLED ILLUMINATION

CROSS REFERENCE TO RELATED APPLICATIONS

This application is related to U.S. patent application entitled "COLOR TUNABLE OLED ILLUMINATION DISPLAY AND METHOD FOR CONTROLLED DISPLAY ILLUMINATION," filed concurrently herewith, designated U.S. Ser. No. ________ the entire contents of which are incorporated herein by reference.

BACKGROUND

The invention generally relates to organic illumination sources. The invention particularly relates to organic illumination sources with controllable illumination.

Conventional light sources such as incandescent, fluorescent sources emit color in a pre-defined spectral range, and the color of a single light source cannot be tuned at will. In order to have a color-tunable light-emitting device, a multitude of light sources must be assembled, and the intensity of the light emitted therefrom controlled. This can lead to impractical, physically bulky devices and the resulting color is often spatially not uniform to the eye. Further, for various lighting applications including area illumination sources and backlighting sources for displays, it is desirable to have illumination sources with controllable illumination, where color, intensity, or both is controllable.

Prior approaches to providing specific colored OLED illumination sources include using OLED sources with a plurality of electroluminescent material emitting at different wavelengths or flat displays with arrays of colored OLED elements, such as red, blue, and green emitting OLED elements. Such approaches may fall short of providing the required light intensity and color mixing required for a desired illumination effect.

It would therefore be highly desirable to provide an area illumination source in which the illumination source can be tuned to provide a desired intensity, chromaticity, and color rendition index.

BRIEF DESCRIPTION

In one embodiment of the present invention is a color tunable OLED illumination source including a first OLED layer capable of emitting light of a first color, a second OLED layer capable of emitting light of a second color and disposed on the first OLED layer, each of said first and second OLED layers including alternating active light-emitting areas and inactive non-light emitting areas; said first OLED layer comprising a first substrate, a first transparent electrode layer disposed on the substrate, a first electroluminescent layer capable of emitting light of the first color disposed on the first transparent electrode layer, and a first patterned metallized electrode layer forming the alternating active light-emitting areas and inactive non-light emitting areas; and said second OLED layer comprising a second substrate, a second transparent electrode layer disposed on the substrate, a second electroluminescent layer capable of emitting light of the second color disposed on the second transparent electrode layer, and a second patterned metallized electrode layer forming the alternating active light-emitting areas and inactive non-light emitting areas; wherein light emitted by the active light-emitting areas of the first OLED layer is transmitted through the inactive non-light emitting areas of the second OLED layer.

In a further embodiment of the present invention is a system including a color tunable OLED illumination source comprising a plurality of OLED layers fabricated on different substrates assembled in a stacked configuration, wherein the plurality of OLED layers include alternating active light-emitting areas and inactive non-light emitting areas; and wherein the inactive non-light emitting areas of each of the plurality of OLED layers is configured to transmit light incident on it and emitted by the plurality of OLED elements of each of the other OLED devices; and a control unit for selectively delivering power to each layer of the plurality of OLED layers.

In still another embodiment of the present invention is method for color and/or intensity tuning of an illumination source, said method including selectively providing electric power to one or more OLED layers of a plurality of OLED layers of a color tunable OLED illumination source to color and/or intensity tune the light output of the illumination source, wherein each of the plurality of OLED layers comprises alternating active light-emitting areas and inactive non-light emitting areas; and wherein the inactive non-light emitting areas of each of the plurality of OLED layers is configured to transmit light emitted by underlying OLED layers.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention relate to organic illumination sources for controllable illumination, systems including such organic illumination sources and methods for controlled illumination.

As used herein, the term "organic illumination source" refers to an organic light emitting device (OLED) illumination source. As used herein, the term "OLED" refers to devices including organic light emitting materials generally, and includes but is not limited to organic light emitting diodes. As used herein, the term "OLED element" refers to the basic light-producing unit of the area illumination sources of the present invention, comprising at least two electrodes with a light-emitting organic material disposed between the two electrodes. As used herein, the term "OLED layer" refers to a light-producing unit including at least one OLED element.

In the following specification and the claims that follow, reference will be made to a number of terms that shall be defined to have the following meanings. The singular forms "a", "an" and "the" include plural referents unless the context clearly dictates otherwise.

The term "electroactive" as used herein refers to a material that is (1) capable of transporting, blocking or storing charge (either positive charge or negative charge), (2) light-absorbing or light emitting, typically although not necessarily fluorescent, and/or (3) useful in photo-induced charge generation, and/or 4) of changing color, reflectivity, transmittance upon application of bias.

As used herein, the term "disposed on" or "deposited on" refers to disposed or deposited on and in contact with, or disposed or deposited on but with intervening layers therebetween or disposed or deposited on with a finite separation with underlying layers.

As used herein, the term "transparent" refers to greater than 10% average transmission in the visible region of the electromagnetic spectrum. In some embodiments, "transparent" refers to greater than 50% average transmission. In still further embodiments, "transparent" refers to greater than 80% average transmission.

As used herein, the term "controlled illumination" refers to control of intensity, chromaticity, and/or color rendition index (CRI) of the illumination source.

As will be appreciated by one skilled in the art, an OLED element typically includes at least one organic layer, typically an electroluminescent layer, sandwiched between two electrodes. Upon application of an appropriate voltage to the OLED element, the injected positive and negative charges recombine in the electroluminescent layers to produce light.

In one embodiment of the present invention, the OLED illumination includes a plurality of OLED layers. The OLED layers include active light emitting areas and inactive non-light emitting areas. The OLED layers are disposed such that light emitted by active light emitting areas of an OLED layer is transmitted through the inactive non-light emitting areas of the subsequent OLED layer or layers and emerges out of the illumination source.

Figure 1:
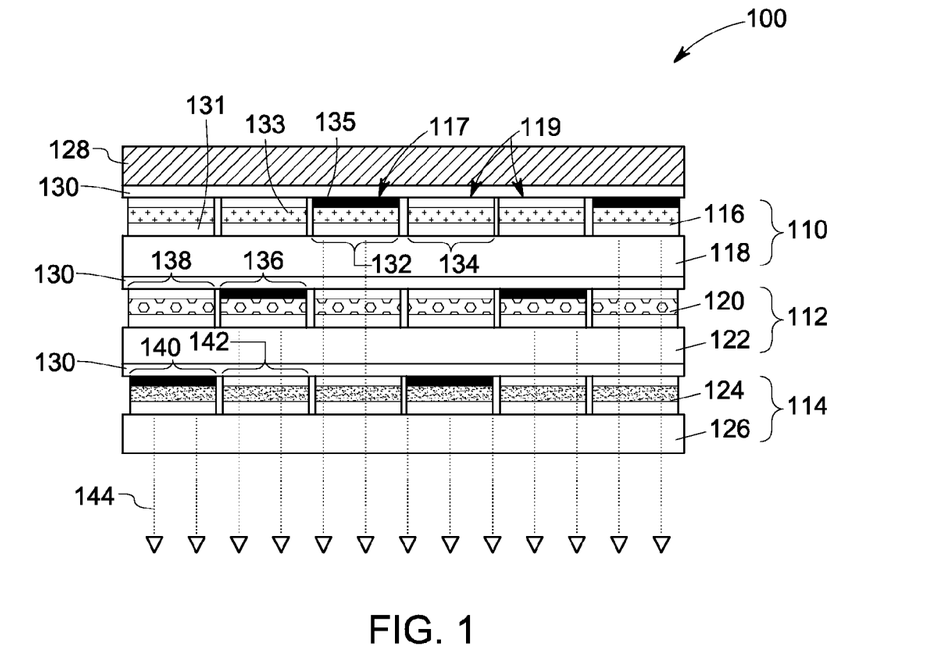
FIG. 1 is a schematic cross-sectional view of an illumination source in one embodiment of the present invention.

In the cross-sectional view of illumination source 100 shown in FIG. 1, a first OLED layer 110 is disposed on a second OLED layer 112, which in turn is disposed on a third OLED layer 114. The first OLED layer 110 includes a device region 116, and a transparent substrate 118. The device region 116 includes alternating active light emitting areas 117 and inactive non-light emitting areas 119. Similarly, the second OLED layer includes device region 120 including alternating active light emitting areas and inactive non-light emitting areas, and transparent substrate 122, and the third OLED layer 114, includes device region 124, and the transparent substrate 126. The illumination source further may include a reflective layer 128. In a non-limiting example, the reflective layer is an aluminum layer. In one embodiment, the OLED layers 110, 112, 114 are laminated together using adhesive layers 130.

In the illustrated embodiment shown in FIG. 1, the active light emitting area 117 of the first OLED layer 110 includes one or more active OLED elements 132 and inactive non-light emitting area 119 of the first OLED layer 110 includes one or more inactive OLED elements 134. The active elements 132 and inactive elements 134 each include a first transparent electrode layer 131 disposed on the transparent substrate and a first electroluminescent layer 133 disposed on the first transparent electrode 131. A first patterned metallized electrode layer 135 is disposed on the first electroluminescent layer 133 to form the active OLED elements. The inactive OLED elements, including 134, lack a metallized electrode layer.

Similarly, the second OLED layer 112 includes active light emitting areas including active elements 136 and inactive non-light emitting areas including inactive OLED elements 138. The third OLED layer 114 includes active light emitting areas including active elements 140 and inactive non-light emitting areas including inactive OLED elements 142. During operation, light emitted by the active light-emitting areas of the first OLED layer 110 is transmitted through the inactive non-light emitting areas of the second OLED layer 112 and the inactive non-light emitting areas of the third OLED layer 114. The light emitted by the active areas of the second OLED layer 112 is transmitted through the inactive areas of the third OLED layer 114. The composite light 144 including the light emitted by the first, second and third OLED layers emerge through the transparent substrate 126.

In some embodiments, at least two of the OLED layers emit light of different color. In one embodiment including three OLED layers, the OLED layers emit red, blue, and green light respectively. In one embodiment of the present invention, the illumination source is a color tunable illumination source. In a further embodiment, the illumination source is a white light device.

In one embodiment of the present invention, the arrangement of the OLED elements in the OLED layers vary from one OLED layer to another so as to produce a desired combination of light intensity, chromaticity and color rendition index. For example, in the embodiment illustrated in FIG. 2, the illumination source 200 includes a first OLED layer 210 including a device region 216 and a transparent substrate 218. The source 200 further includes a second OLED layer 212 including a device region 220 and a transparent substrate 222. The pattern or arrangement of the active light emitting areas and the inactive non-light emitting areas in the first OLED layer 210 is different from the arrangement in the second layer 212. In the cross-sectional view shown in FIG. 2, the first OLED layer includes two active OLED elements alternating with one inactive OLED element, whereas in the second OLED layer 212, two inactive OLED elements alternate with one active OLED element. Similar arrangements may be used depending upon the intensity and color emitted by OLED elements emitting different colors such that the combination produces a desired color mixing. The first and second OLED layers are disposed on one another in a manner so as to allow the light from the two active OLED elements of the first OLED layer to emerge out of the two inactive OLED elements of the second OLED layer. It should be noted that the size and shape of elements of the first layer might differ from the size and shape of the elements in the second layer.

Figure 2:
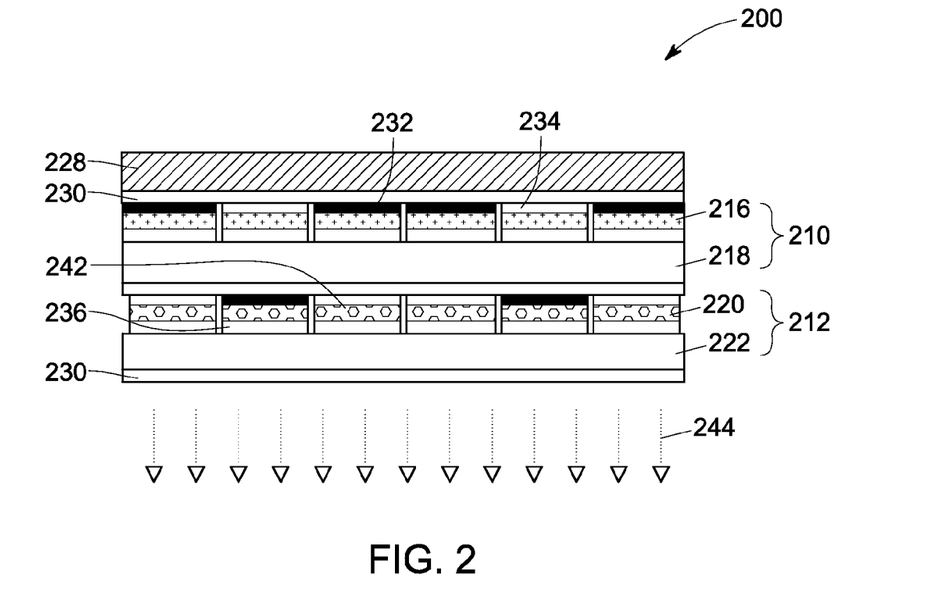
FIG. 2 is a schematic cross-sectional view of an illumination source in one embodiment of the present invention.

Also, elements of the first layer may be oversized with respect to the inactive areas of the second layer, or otherwise partially hidden behind the active areas of the second layer.

Figure 3:
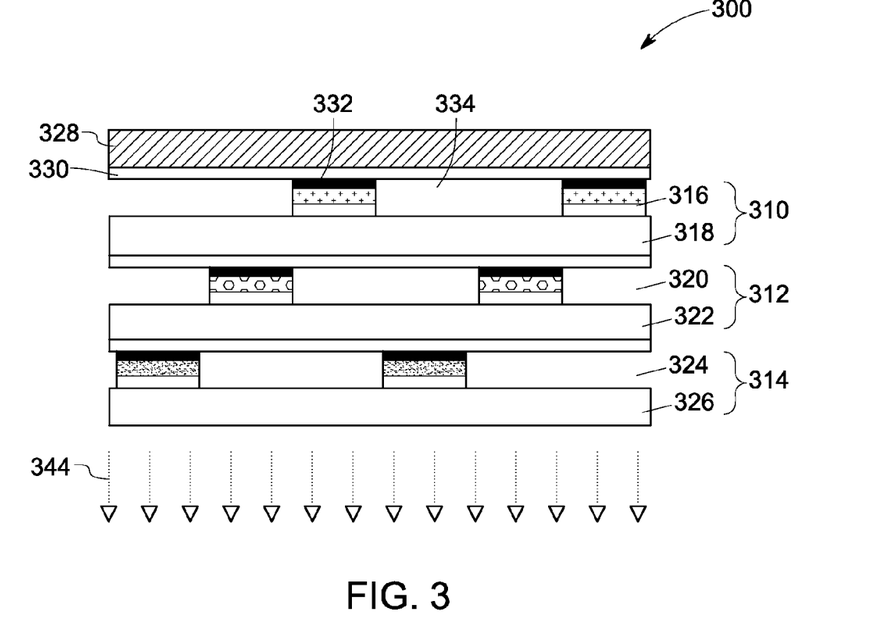
FIG. 3 is a schematic cross-sectional view of an illumination source in one embodiment of the present invention.

In the illustrated embodiment shown in FIG. 3, the illumination source includes three OLED layers 310, 312, 314, each including device regions 316, 320, 324, respectively and transparent substrate 318, 322, 326, respectively. In the illustrated embodiment, an OLED layer, for example OLED layer 310 includes active light emitting areas 332 and inactive non-light emitting areas 334. As shown in FIG. 3, the inactive non-light emitting area 334 includes a substrate area without any inactive OLED element disposed on it. Light 344 from the one or more OLED layers emerges through the transparent substrate 326. In other embodiments, the inactive areas may contain only a portion of the transparent layers of the active structure.

The electroluminescent layer may include light emitting polymeric or non-polymeric small molecule materials. Non-limiting examples of electroluminescent layer materials which may be used in the illumination source include poly (N-vinylcarbazole) (PVK) and its derivatives; polyfluorene and its derivatives and copolymers such as poly(alkylfluorene), for example poly(9,9-dihexylfluorene), poly(dioctylfluorene) or poly{9,9-bis(3,6-dioxaheptyl)-fluorene-2,7-diyl}, poly(para-phenylene) (PPP) and its derivatives such as poly(2-decyloxy-1,4-phenylene) or poly(2,5-diheptyl-1,4-phenylene); poly(p-phenylene vinylene) (PPV) and its derivatives such as dialkoxy-substituted PPV and cyano-substituted PPV; polythiophene and its derivatives such as poly (3-alkylthiophene), poly(4,4'-dialkyl-2,2'-bithiophene), poly (2,5-thienylene vinylene); poly(pyridine vinylene) and its derivatives; polyquinoxaline and its derivatives; and polyquinoline and its derivatives. In one particular embodiment a suitable light emitting material is poly(9,9-dioctylfluorenyl-2,7-diyl) end capped with N,N-bis(4-methylphenyl)-4-aniline. Mixtures of these polymers or copolymers based on one or more of these polymers and others may also be used.

Another class of suitable materials used in electroluminescent devices are polysilanes. Typically, polysilanes are linear silicon-backbone polymers substituted with a variety of alkyl and/or aryl side groups. They are quasi one-dimensional materials with delocalized sigma-conjugated electrons along polymer backbone chains. Examples of polysilanes comprise poly(di-n-butylsilane), poly(di-n-pentylsilane), poly(di-n-hexylsilane), poly(methylphenylsilane), and poly{bis(p-butylphenyl) silane}.

In one embodiment, the metallized patterned electrode layer includes but is not limited to materials having low work function value. In a further embodiment, the metallized patterned layer is a cathode layer. Non-limiting examples of cathode layer materials include materials such as K, Li, Na, Mg, Ca, Sr, Ba, Al, Ag, Au, In, Sn, Zn, Zr, Sc, Y, Mn, Pb, elements of the lanthanide series, alloys thereof, particularly Ag—Mg alloy, Al—Li alloy, In—Mg alloy, Al—Ca alloy, and Li—Al alloy and mixtures thereof. Other examples of cathode materials may include alkali metal fluorides, or alkaline earth fluorides, or mixtures of fluorides. Other cathode materials such as indium tin oxide, tin oxide, indium oxide, zinc oxide, indium zinc oxide, zinc indium tin oxide, antimony oxide, carbon nanotubes, and mixtures thereof are also suitable. Alternatively, the cathode can be made of two layers to enhance electron injection. Non-limiting examples include, but are not limited to, an inner layer of either LiF or NaF followed by an outer layer of aluminum or silver, or an inner layer of calcium followed by an outer layer of aluminum or silver.

In one embodiment, the transparent electrode includes materials such as but not limited to high work function materials. Non-limiting examples of anode materials include, but are not limited to, indium tin oxide (ITO), tin oxide, indium oxide, zinc oxide, indium zinc oxide, nickel, gold, and like materials, and mixtures thereof. In some embodiments, the transparent substrate is found in combination with the transparent electrode. For example, an indium tin oxide/poly(ethylene terephthalate) combination layer may be used to form the OLED layer.

Non limiting examples of transparent substrates include poly(ethylene terephthalate), poly(ethylene naphthalate), polyethersulfone, polycarbonate, polyimide, acrylate, polyolefin, glass, very thin metal layers, and combinations thereof. In some embodiments, the transparent substrate is a flexible substrate rendering the illumination source flexible.

The OLED layers may further include other electroactive layers such as but not limited to hole transport layers, hole injection layers, electron transport layers, electron injection layers, and photoluminescent layers.

The various layers in the OLED elements can be deposited or disposed using techniques such as but not limited to spin coating, dip coating, reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic process, Langmuir process and flash evaporation, thermal or electron-beam assisted evaporation, vapor deposition, plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including, but not limited to, reactive sputtering, electron-cyclotron-resonance plasma-enhanced chemical-vapor deposition (ECRPECVD"), inductively coupled plasma-enhanced chemical-vapor deposition ("ICPECVD"), and combinations thereof.

The illumination source of the present invention may include additional layers such as, but not limited to, one or more of abrasion resistant layers, chemically resistant layers, photoluminescent layers, radiation reflective layers, barrier layers, planarizing layers, optical scattering layers, optical diffuser layers, light enhancement layers, and combinations thereof.

In one embodiment of the present invention, the illumination source provides uniform light intensity across the viewed area, wherein variation in the light intensity is within 10% of the average light intensity.

Figure 4:
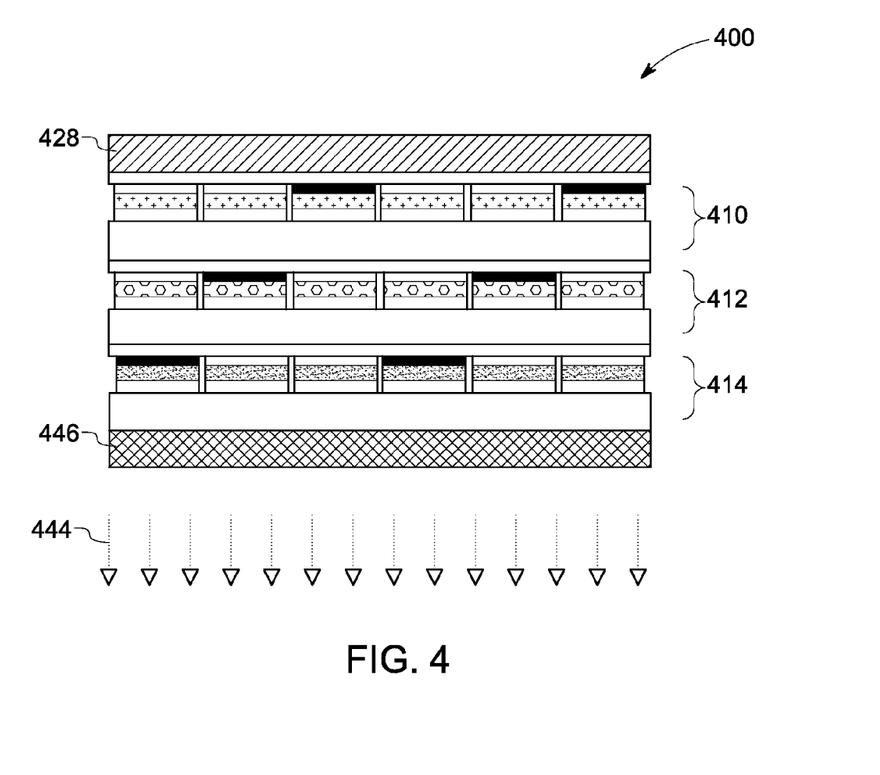
FIG. 4 is a schematic cross-sectional view of an illumination source in one embodiment of the present invention.

In the cross-sectional view of illumination source 400 shown in FIG. 4, OLED layers 410, 412, and 414 are shown. Illumination source 400 includes reflector 428 disposed on one end of the source to reflect any light from the OLED layers back towards the light emerging end of the device. Illumination source 400 further includes light management layer 446 in the form of a diffuser element mounted on the OLED layers to diffuse the light emerging from the two or more OLED layers. In a non-limiting example, the diffuser element may be formed through texturing the surface of a transparent material to make a surface diffuser. Examples of other light management elements suitable for use in embodiments of the present invention include transparent material having one or both surfaces textured with positive or negative lens structures and Fresnel lens structures and any combination of such structures. Other waveguiding and light bending elements can also used. In one embodiment, the light management element is a curved layer. In another embodiment, a light management element, such as a scattering element, may be mounted on the OLED layers to scatter the light emerging from the two or more OLED layers. The scattering element may be formed by suspending particles with a high index within a lower index medium to make a volumetric scattering system. This type of bulk diffuser may also be used in combination with other light management elements.

Figure 5:
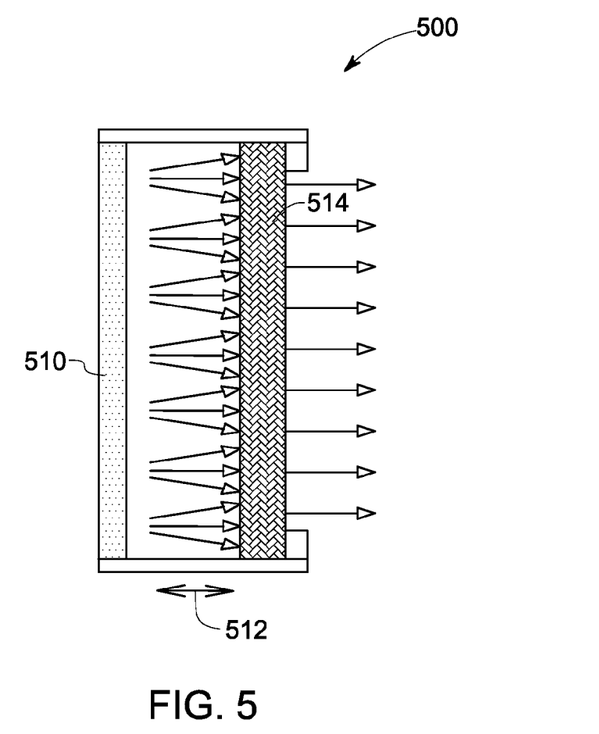
FIG. 5 is a schematic cross-sectional view of an illumination source in one embodiment of the present invention.

In one embodiment of the illumination source, a light management element, such as a diffuser element is mounted/disposed on the OLED layers at a finite distance from the OLED layers. FIG. 5 shows a cross-sectional view of such an illumination source 500 where diffuser 514 is at distance 512 from the OLED layers. The distance at which the diffuser is mounted may be determined by the size and arrangement and the emission spectrum of the OLED elements, to produce the desired appearance, for example a uniform appearance across the viewed area.

In various embodiments, depending upon the intensity and color of the light emitted by the active OLED elements and the desired color mixing, the active and inactive OLED elements may be variously arranged. Further, the OLED elements, active and inactive, may be of various shapes and sizes, for example, regular geometrical shapes or irregular shapes. Geometrical shapes include but are not limited to square, rectangular, triangular, pentagonal, hexagonal etc., shaped elements. The OLED elements may have straight or curved sides or edges. In one embodiment, the OLED elements are squares with sides of about 1.25 cm. In another embodiment, the OLED elements are rectangular shaped with sides of about 1.25 and about 0.625 cm. In another embodiment, the OLED elements are rectangular shaped with sides of about 1.25 cm and about 0.3125 cm.

In some embodiments of the present invention, the OLED layers in the illumination source are physically modular. As used herein, the term "physically modular" means that the layers can be individually removed or replaced. In a further embodiment, the layers are mounted using quick release connectors.

In some embodiments of the present invention, the OLED layers in the illumination source are "electrically modular". As used herein, the term "electrically modular" refers to an attribute of a layer whereby the layer can be independently electrically controlled. For example, layers disposed within the illumination source of the present invention are "electrically modular" in that the voltage applied to each individual layer may be independently varied.

Figure 6:
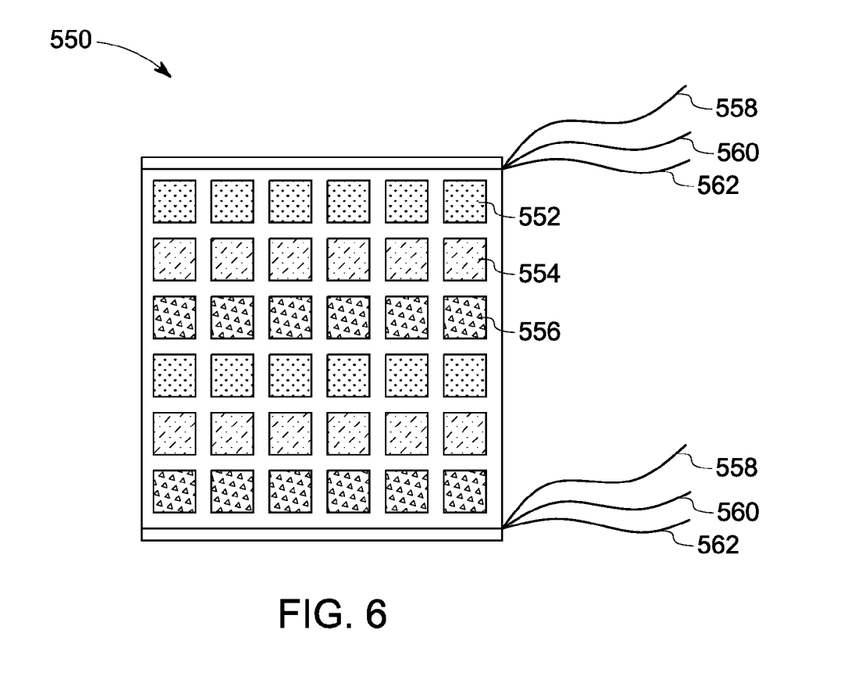
FIG. 6 is a front view of an illumination source in one embodiment of the present invention.

FIG. 6 shows a front view of illumination source 550 including three OLED layers 552, 554 and 556, each emitting light of a different color. Each of the layers is individually wired through connectors, 558, 566, 562, respectively. In one embodiment, the anode contacts for the three OLED layers can be joined together, while the cathode contacts are electrically separate, still enabling separate electrical control of the three OLED layers. In one embodiment, two or more OLED layers may be connected in series. In another embodiment, the two or more OLED layers may be connected in parallel.

In one embodiment of the present invention, the illumination source may further include circuit elements for controlling and delivering electrical power to the OLED layers. In a further embodiment, the illumination source is configured to selectively power one or more OLED layers. One or more OLED elements included in an OLED layer may be further connected to circuit elements capable of controlling the light emission from each of the OLED elements as well. The illumination source may include circuit elements such as AC to DC converters and diodes placed in series, to convert available AC power to the required DC power. In a further embodiment, the illumination source may be directly powered by AC power. Non-limiting examples of other circuit elements that may be present in the illumination source, include zener diodes, resistors, varistors, voltage dividers, and capacitors. In one embodiment, the OLED elements within the same OLED layer are connected together is a series connected OLED architecture.

General principles of series connected OLED architecture and the use of circuit elements for controlling and delivering electrical power to the one or more OLED layers or OLED elements can be more clearly understood by referring to U.S. Pat. Nos. 7,049,757; 6,566,808; 6,800,999; US 2002/0190661; US 2004/0251818; and US 2006/0125410, each of which is incorporated herein by reference. It should be noted that with respect to the interpretation and meaning of terms in the present application, in the event of a conflict between this application and any of the above referenced document, the conflict is to be resolved in favor of the definition or interpretation provided by the present application.

In one embodiment of the present invention, the illumination source emission is color tunable. In a non-limiting example, the illumination source produces white light. In one embodiment the white light has a color temperature ranging from about 5500° K. to about 6500° K. As used herein, "color temperature" of an illumination source refers to a temperature of a blackbody source having the closest color match to the illumination source in question. The color match is typically represented and compared on a conventional CIE (Commission International de l'Eclairage) chromaticity diagram. See, for example, "Encyclopedia of Physical Science and Technology", vol. 7, 230-231 (Robert A. Meyers ed, 1987). Generally, as the color temperature increases, the light appears more blue. As the color temperature decreases, the light appears more red. In another embodiment of the present invention, the illumination source emits white light having a color temperature ranging from about 2800° K. to about 5500° K. In certain embodiments the illumination source emits white light having a color temperature ranging from about 2800° K. to about 3500° K. In some embodiments, the illumination source has a color temperature about 4100° K.

In one embodiment, an illumination source with a color temperature in the range from about 5500° K. to about 6500° K. has a color rendering index ranging from about 60 to about 99. As used herein, color rendering index (CRI) is a measure of the degree of distortion in the apparent colors of a set of standard pigments when measured with the light source in question as opposed to a standard light source. The CRI is determined by calculating the color shift, e.g. quantified as tristimulus values, produced by the light source in question as opposed to the standard light source. Typically, for color temperatures below 5000° K., the standard light source used is a blackbody of the appropriate temperature. For color temperatures greater than 5000° K., sunlight is typically used as the standard light source. Light sources having a relatively continuous output spectrum, such as incandescent lamps, typically have a high CRI, e.g. equal to or near 100. Light sources having a multi-line output spectrum, such as high pressure discharge lamps, typically have a CRI ranging from about 50 to about 90. Fluorescent lamps typically have a CRI greater than about 60.

In a further embodiment, an illumination source with a color temperature in the range from about 5500° K. to about 6500° K. has a color rendering index ranging from about 75 to about 99. In a still further embodiment, an illumination source with a color temperature in the range from about 5500°

K. to about 6500° K. has a color rendering index ranging from about 85 to about 99. In still another embodiment, an illumination source with a color temperature in the range from about 2800° K. to about 5500° K. has a color rendering index of at least about 60. In still another embodiment, an illumination source with a color temperature in the range from about 2800° K. to about 5500° K. has a color rendering index of at least about 75. In still another embodiment, an illumination source with a color temperature in the range from about 2800° K. to about 5500° K. has a color rendering index of at least about 85.

In one embodiment, the illumination source is mountable onto a structure. In a non-limiting example, the illumination source is adapted for wall mounting. The illumination source may alternatively be mounted upon the ceiling or be suspended from the ceiling. In an alternative embodiment, the illumination source is free standing.

In one embodiment of the present is a system including an OLED illumination source including a plurality of OLED layers fabricated on different substrates in a stacked configuration. The plurality of OLED layers include alternating active light-emitting areas and inactive non-light emitting areas such that the inactive non-light emitting areas of the plurality of OLED layers is configured to transmit light emitted by the underlying OLED layers. The system further includes a control unit for selectively delivering power to each layer of the plurality of OLED layers. The control unit may include controls for intensity selection and/or color selection. In one embodiment, the system is for use in transportation such as but not limited to an aircraft, where interior illumination is used.

In another embodiment, the present invention relates to a method for controlling the color and/or intensity of the light output of an illumination source including a plurality of OLED layers. As used herein, the term "color" refers to chromaticity and/or CRI. The method includes providing an illumination source including The method further includes providing electrical power to said at least one OLED layer, whereby color and/or intensity of the light output of the illumination source is tuned. In a non-limiting example, intensity tuning is achieved by applying identical or varied voltages to the two or more layers. As used herein, the term "tuning" is used to refer to either selecting a value and/or tuning from one value to another. In a further example, the intensity is tuned by varying the voltage level applied to one or more OLED layers. In a non-limiting example, color tuning in an illumination source including a plurality of OLED layers is achieved by selectively powering one or more OLED layers emitting light at the same or varied wavelengths. In a further example, color tuning is achieved by varying the power levels used to drive the one or more OLED layers. The method may further include using a diffuser mounted on the OLED layers to diffuse light emitted by the plurality of OLED layers.

In another aspect, the present invention relates to a color display device including a light modulating element and a color tunable OLED illumination source configured to illuminate the light modulating element. The illumination source includes a plurality of OLED layers fabricated on different substrates. Each of the plurality of OLED layers include alternating active light-emitting areas and inactive non-light emitting areas and are assembled in a stacked configuration such that the inactive non-light emitting areas of each of the plurality of OLED layers is configured to transmit light emitted by underlying OLED layers.

In one embodiment, the light modulating element is an LCD element, but it should be understood that other forms of light modulating elements, such as but not limited to electrochromic devices, diffractive devices, deformable mirrors, fall within the scope of this invention.

During operation, liquid crystal devices may be illuminated from the rear (back-lighting), so that most of the light travels directly through the liquid crystal and outwardly to the eye of a viewer or front-lit with the light approaching the LCD from the front and reflecting back towards the viewer's eye. For a backlit LCD system, the device has a transmissive liquid crystal element; for a front-lit system, the device has a reflective liquid crystal element.

In one embodiment, the LCD display uses a white OLED illumination source backlight including a plurality of OLED layers and liquid crystal elements overlaid with color (e.g. RGB) filters. By modulating light transmission through the liquid crystal element, desired emissive color is achieved by filtering the transmitted white light.

In another embodiment, the liquid crystal display does not have color filters. The display has a color tunable OLED illumination source. In this embodiment, the display color is achieved by having red, green and blue light emitting OLED layers, or other suitable color combinations, as backlight. By sequentially applying red, green, and blue color (field sequential color) to the backlight, synchronized in a suitable way with electronic control of the liquid crystal elements, the desired color is emitted by the display without the use of color filters and the desired color is perceived by the human eye because of persistence of vision. This embodiment prevents loss of energy by avoiding filtering light through a color filter.

In one embodiment, the OLED layers are strobed at least 3× the frame rate. Normally 30 frames per second for the odd and even frames are used. In one example the OLED layers are strobed at 90 fps or 180 fps for the odd and even frames considered separately, to allow the colors to be merged at the observer's eye.

In one embodiment, the OLED output is pulse width modulated to be only about ⅓ of an individual frame time to reduce motion blur. Motion blur occurs due to the finite response time of the LCD pixels and is manifest by a dragging of the light across multiple pixels. In one example, the time frames of about 1/540 sec (~1.8 ms) are used.

Figure 11:
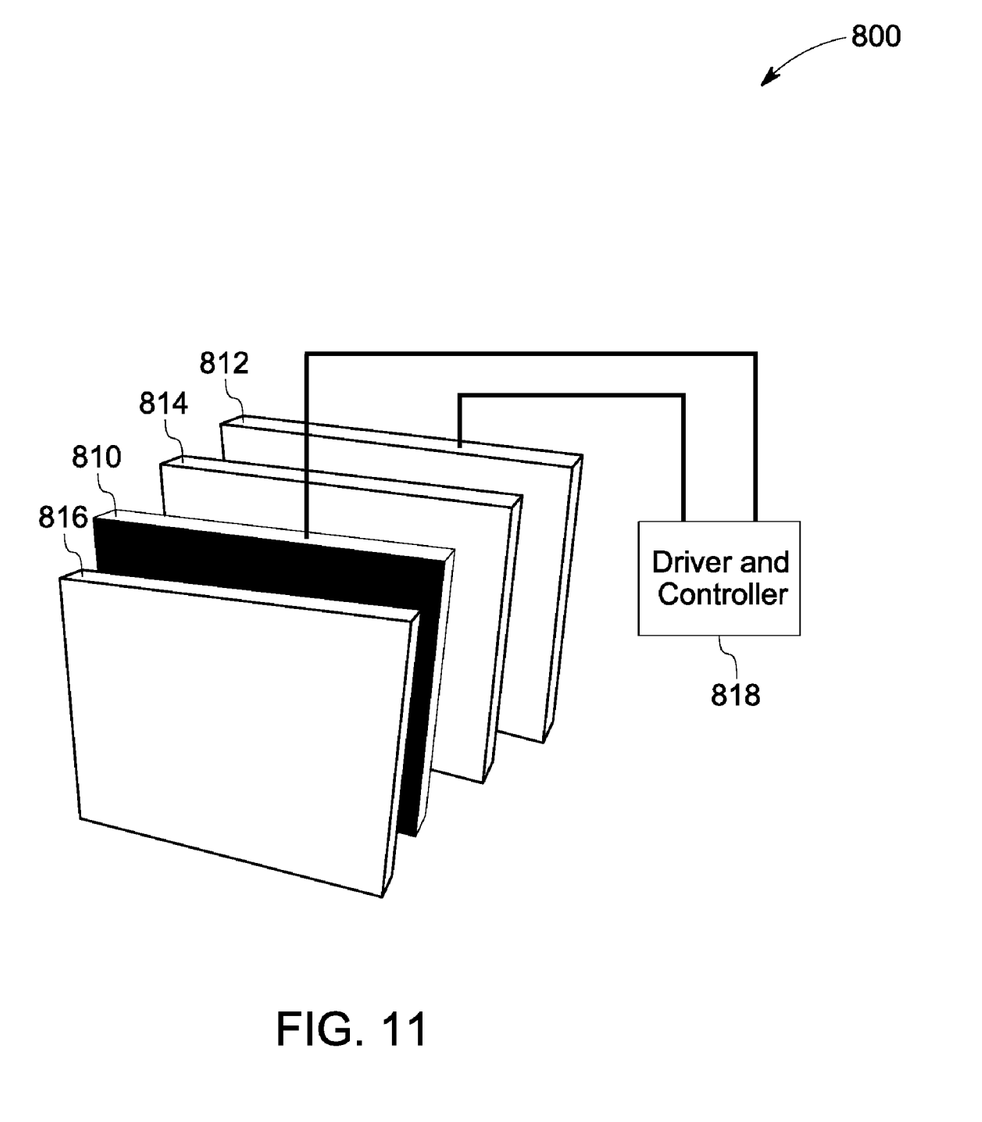
FIG. 11 is a schematic representation of a display device with an OLED illumination source in accordance with one embodiment of the present invention.

In the illustrated embodiment shown in FIG. 11, color display device 800 includes a light transmissive LCD element 810 and an OLED illumination source 812 serving as a backlight for the LCD element. In one embodiment, the LCD element comprises a plurality of pixels, which behave as light valves modulating the light transmittance through the pixel. In one embodiment, the LCD element changes the polarization axis of the light transmitted through the element. The level of change in polarization upon transmittance through each pixel can be externally controlled.

In some embodiments, the color display device further includes one or more light management films such as but not limited to diffusers, polarizers, and scattering elements. In one embodiment, the color display device includes a first polarizer 814 disposed between the OLED illumination source and a first side of the LCD element to polarize the light emerging from the OLED illumination source. In a further embodiment, the color display device further includes a second polarizer 816 disposed between the OLED illumination source and a second side of the LCD element. In one embodiment, the polarization axes of the first and second polarizers are normal to each other. Therefore, the rotation of polarization by each pixel can determine the transmitted intensity.

In a further embodiment, the color display device further includes a driver for varying the transmittance of each pixel of the light-transmissive LCD synchronously with the temporally varying backlight color to produce a color display. In a still further embodiment, the color display device further includes a controller for selectively powering each layer of OLED illumination source in to produce a temporally varying planar backlight color, cycling through different colors produced by the plurality OLED layers with a frequency higher than a human visual response frequency. In the illustrated embodiment shown in FIG. 11, the driver for the LCD and the controller for the OLED illumination source are shown to be an integrated driver and controller 818. In other embodiments the driver and controller may be separate and independently operated.

In one embodiment, color display device includes an organic illumination source including three organic emitting layers with alternating active and inactive areas, where the inactive non-light emitting areas of the OLED layers is configured to transmit light emitted by underlying OLED layers. Each of the three OLED layers is capable of emitting a different bandwidth, for example in green, blue, and red, in time sequential fashion, to provide a full color display. Color LCD displays are created by varying the intensity of transmitted light for each of OLED layers emitting, for example in red, green, and blue wavelength range.

In a further embodiment, the OLED backlight 812 is capable of generating a white light spectrum by adjusting the ratio of the red emission, the green emission and the blue emission. Accordingly, by activating each OLED layer in accordance with the amount of each color (red, green, or blue) required during the time that the color OLED layer is activated, a complete and full color image is produced for each cycle of the three OLED panels, or a white light is produced. It will of course be understood that more than one OLED layer of each color can be utilized if more than one is required to provide full and uniform illumination.

In a further embodiment of the present system is a method of illuminating a backlit display. The method includes selectively providing electric power to one or more OLED layers of a plurality of OLED layers of a color tunable OLED illumination source to color and/or intensity tune the light output of the illumination source, temporally varying the backlight color, cycling through different colors produced by one or combinations of two or more OLED layers with a frequency higher than a human visual response frequency, synchronously varying the transmittance of each pixel of the light-transmissive LCD in synch with the temporally varying planar backlight color to produce a color display.

Embodiments of the present invention can provide thin and compact white and color tunable light sources. Further, embodiments of the present invention can also provide for flexible color tunable light sources for application such as display backlighting. By fabricating each OLED layer separately, various deposition processes can be optimized for a particular OLED layer. Very high overall fill factors (active light emitting area) can be achieved by avoiding the need to have complicated electrical lines in one plane (on one substrate). Further, such devices can also be manufactured as fault-tolerant light sources, using a combined parallel-series electrical interconnection architecture. In addition, embodiments of the OLED illumination source of the present invention for backlighting purposes can provide substantial weight reduction, reduced thickness, and flexibility of the display, and improved brightness uniformity over large area.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLE 1

An OLED illumination source was fabricated. The OLED illumination source included three physically and electrically modular OLED layers, which were independently fabricated. Each OLED layer included a plurality of rectangular OLED elements electrically interconnected by a combination of series and parallel electrical connections. This so-called fault-tolerant OLED architecture and method of making has previously been described in U.S. Pat. No. 7,049,757.

A first OLED layer was manufactured over an ITO/PET substrate. The ITO layer was patterned using a standard photolithography and a wet etch process, to form a plurality of rectangular and electrically insulated ITO elements disposed on the PET substrate. A solution of PEDOT:PSS, (obtained from H.C. Starck. Inc., product name Bayton P VP CH 800) was spin-coated on top of the ITO pattern to form a continuous layer approximately 70 nm thick. A solution of red light emitting polymer RP 145 obtained from Dow Chemical Company was spin coated over the substrate to form a light-emitting layer about 70 nm thick on top of the PEDOT:PSS layer In the next step portions of both polymers were removed in the areas where cathode-to-anode interconnection was to be established. A patterned metallized cathode layer was then deposited on the light emitting polymer layer by evaporation through a shadow mask with rectangular openings. The metallic pattern was suitably aligned with respect to the ITO pattern to form active light emitting elements of 1.25 cm by 0.625 cm size alternating with inactive non-light emitting elements. A second OLED layer was manufactured over a patterned ITO/PET substrate in a similar manner. A layer of about 70 nm thick green light emitting polymer LUMATION 1304, obtained from Dow Chemical, was spin coated over the previously deposited PEDOT:PSS layer. A patterned metallized layer was then disposed on the light emitting polymer layer to form active light emitting elements of 1.25 cm by 0.625 cm size alternating with inactive non-light emitting elements. A third OLED layer was manufactured over a third patterned ITO/PET substrate. A layer about 70 nm thick of blue polyfluorene based light emitting polymer BP 105 obtained from Dow Chemical was spin coated over the ITO/PET substrate with PEDOT:PSS layer. A patterned metallized layer was then disposed on the light emitting polymer layer to form active light emitting elements of 1.25 cm by 0.625 cm size alternating with inactive non-light emitting elements.

Figure 7:
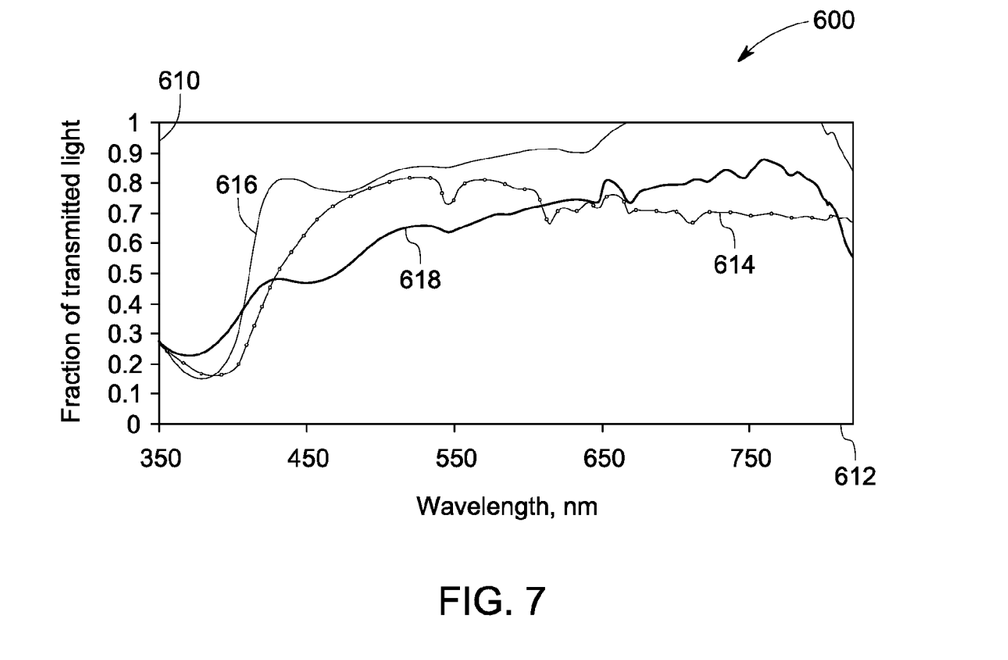
FIG. 7 is a graphical representation of wavelength versus fraction of light transmitted for red, blue, green inactive non-light emitting areas in one embodiment of the present invention.

FIG. 7 is a graphical representation of wavelength versus fraction of light transmitted for red 618, blue 614, and green 616 inactive non-light emitting polymer layers in one embodiment of the present invention. The visible light transmission profile (calculated from measured absorbance) shows greater than 50% average transmission in the visible region. Therefore, the non-light emitting elements of each layer are capable of transmitting a significant portion of light emitted from the other layers, without it being necessary to remove the polymers from these regions.

Figure 8:
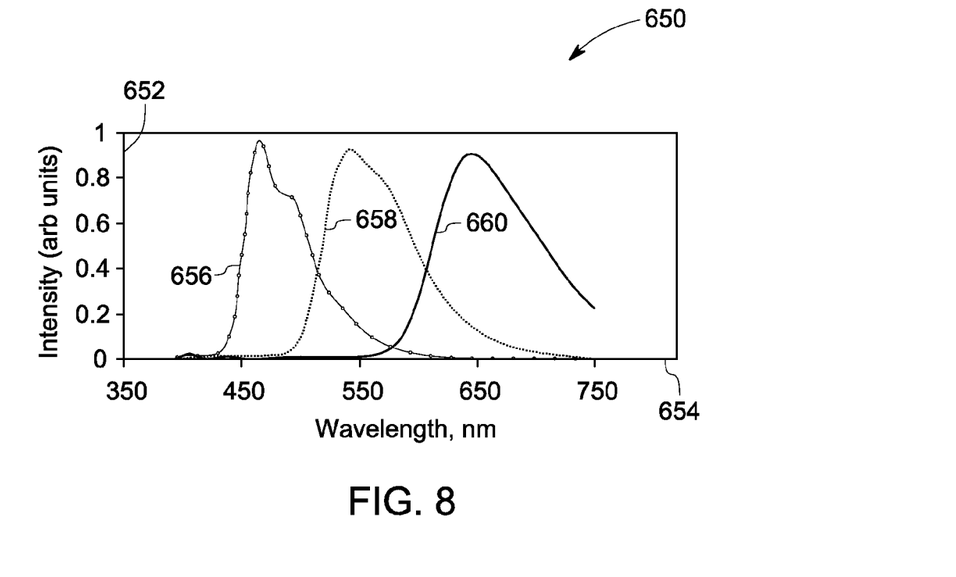
FIG. 8 is a graphical representation of wavelength versus intensity profile for red, blue, and green light emitting individual OLED layers in one embodiment of the present invention.

When operated separately (i.e. not assembled into a three-color device), each OLED layer emitted light in a pre-defined spectral range, determined primarily by the chemical structure of the light-emitting polymer that was used. FIG. 8 is a graphical representation of wavelength versus intensity profile for red, blue, and green light emitting individual OLED layers in one embodiment of the present invention. The intensity peaks 656, 658 and 660 give the emission profile for blue, green, and red individual OLED layers.

Figure 9:
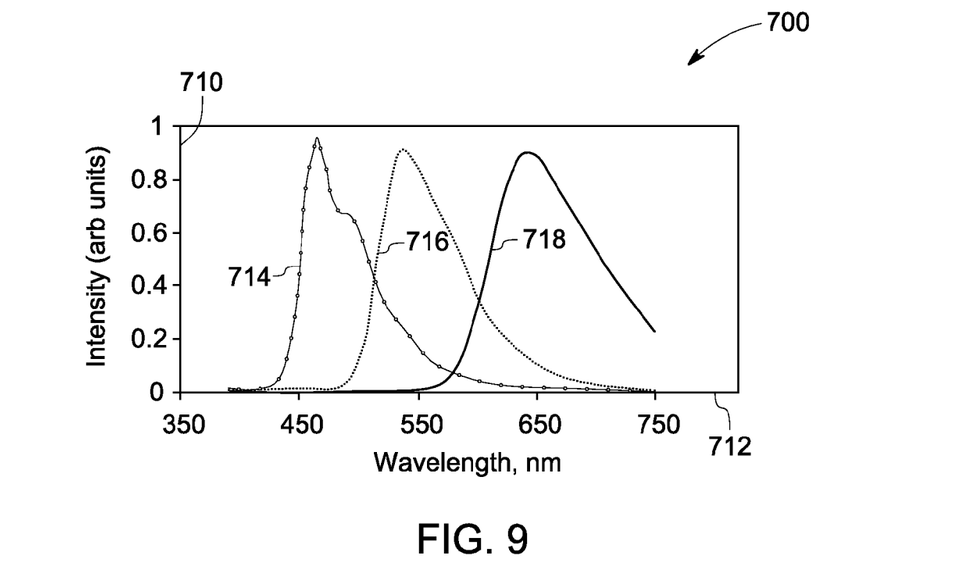
FIG. 9 is a graphical representation of wavelength versus intensity profile for an illumination source including red, blue, and green light OLED layers in one embodiment of the present invention.

The three independently fabricated OLED layers were stacked and adhered together using 0.0762 mm thick optical adhesive tape from 3M such that the active OLED elements of one layer were disposed on the inactive elements of the other two layers. An aluminum reflector was disposed on the back of the first OLED layer. The devices were operated separately in this stacked configuration, and emission spectra were collected for each of the three devices. FIG. 9 is a graphical representation of wavelength 712 versus intensity 710 profile of the illumination source. The intensity of each spectrum was scaled so that they peaked at a relative intensity close to 1. On comparison with the emission plot in FIG. 8, the intensity peaks for blue 714, green 716 and red 718 wavelengths for the stacked OLED layers provide comparable performance to the individual OLED layers and high purity of the individual colors is maintained in the stacked OLED layers. The measured color rendition index (CRI) when intensity of each color was adjusted so that the resulting light was the white light, was about 90. Total lumen output of combined white (red, blue and green) light was measured to be 20 lumens in one case, but could be easily adjusted by adjusting the electrical power to each OLED layer. This illumination structure is equivalent to the one depicted in FIG. 1.

EXAMPLE 2

Figure 10:
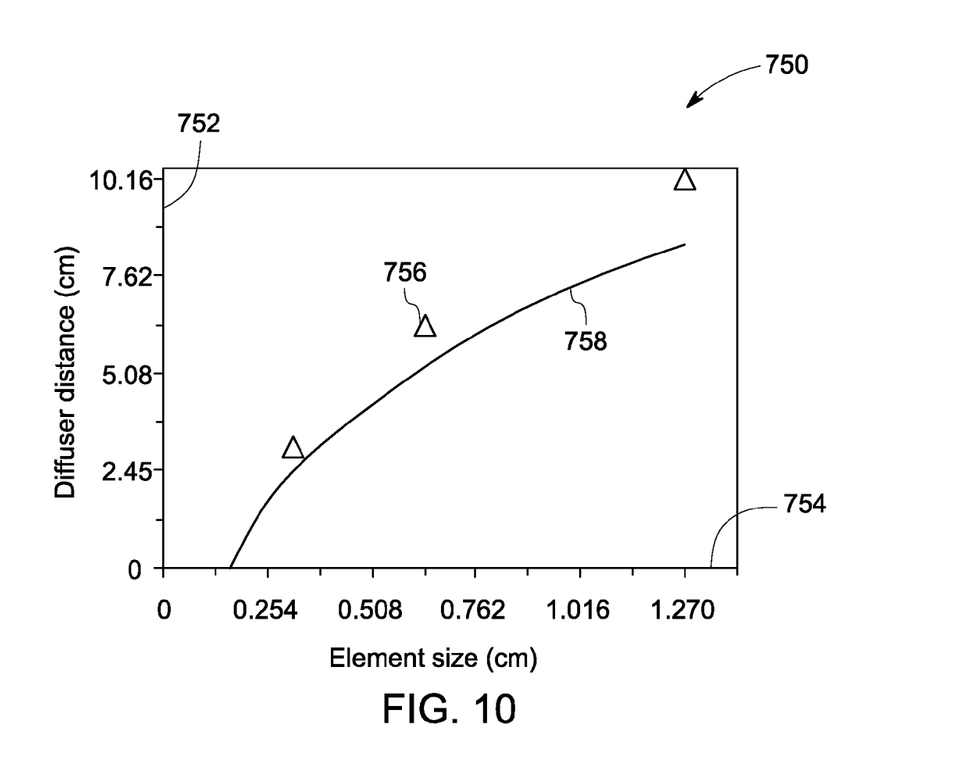
FIG. 10 is a graphical representation of element size versus diffuser distance for an illumination source including red, blue, and green light emitting OLED layers for production of uniform intensity and color in one embodiment of the present invention.

Three different OLED illumination sources were fabricated using techniques similar to the one in EXAMPLE 1. The three OLED devices had elements of size 1.25 cm by 0.3125 cm and were assembled into the illumination source as described above, so that all three emitting colors are visible. A prismatic diffuser element was mounted on this illumination source, in a configuration shown in FIG. 5. The distance of the diffuser element from the illumination source was varied and the distance at which visually uniform color and intensity was obtained was recorded and compared with predicted data for complete blurring. FIG. 10 is a graphical representation of element's smaller dimension 754 (other dimension was fixed at 1.25 cm in this case) versus diffuser distance 752 for production of uniform intensity and color in one embodiment of the present invention. FIG. 10 illustrates good concurrence between the measured data 756 and predicted data 758 and that when the element size is sufficiently small, the diffuser distance can be decreased with decreasing element size to provide uniform color and intensity in a more compact package.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A color tunable OLED illumination source comprising a first OLED layer capable of emitting light of a first color, a second OLED layer capable of emitting light of a second color and disposed on the first OLED layer, each of said first and second OLED layers comprising alternating active light-emitting areas and inactive non-light emitting areas;

said first OLED layer comprising a first substrate, a first transparent electrode layer disposed on the substrate, a first electroluminescent layer capable of emitting light of the first color disposed on the first transparent electrode layer, and a first patterned metallized electrode layer forming the alternating active light-emitting areas and inactive non-light emitting areas; and said second OLED layer comprising a second substrate, a second transparent electrode layer disposed on the substrate, a second electroluminescent layer capable of emitting light of the second color disposed on the second transparent electrode layer, and a second patterned metallized electrode layer forming the alternating active light-emitting areas and inactive non-light emitting areas;

wherein light emitted by the active light-emitting areas of the first OLED layer is transmitted through the inactive non-light emitting areas of the second OLED layer.

2. The color tunable OLED illumination source of claim 1, further comprising a third OLED layer, wherein the third OLED layer comprises a third substrate, a third transparent electrode layer disposed on the substrate, a third electroluminescent layer capable of emitting light of the third color disposed on the third transparent layer, and a third patterned metallized electrode layer forming the alternating active light-emitting areas and inactive non-light emitting areas;

wherein light emitted by the active light-emitting areas of the first OLED layer is transmitted through the inactive non-light emitting areas of the second and third OLED layers and light emitted by the active areas of the second OLED layer is transmitted through the inactive areas of the third OLED layer.

3. The illumination source of claim 1, wherein the active light-emitting areas comprise one or more active OLED elements.

4. The illumination source of claim 1, wherein the inactive non-light emitting areas comprise one or more inactive OLED elements.

5. The illumination source of claim 1, wherein the inactive non-light emitting areas transmit a fraction greater than 50% of light emitted by underlying active light emitting areas in the visible region of the electromagnetic spectrum.

6. The illumination source of claim 1, wherein the inactive non-light emitting areas comprise substrate regions without OLED elements.

7. The illumination source of claim 1, wherein the first electroluminescent layer is a polymeric layer.

8. The illumination source of claim 1, wherein the second electroluminescent layer is a polymeric layer.

9. The illumination source of claim 1, wherein the plurality of OLED layers are independently electrically operable.

10. The illumination source of claim 1, further comprising an adhesive layer between the first and second OLED layers.

11. The illumination source of claim 1, further comprising a reflector layer disposed on the first patterned metallized electrode layer.

12. The illumination source of claim 1, additionally comprising at least one light management element.

13. The illumination source of claim 12, wherein the at least one light management element is selected from the group consisting of a diffuser element, a scattering element, a high contrast patterned element, a transparent white light emitting element, lens, and combinations thereof.

14. The illumination source of claim 12, wherein at least one light management element comprises a high contrast pattern.

15. The illumination source of claim 1, wherein the OLED elements in the OLED layers are connected in a series interconnected architecture.

16. The illumination source of claim 1, wherein the first, second and third substrates are flexible.

17. The illumination source of claim 1, wherein the illumination source produces a white light having a color temperature ranging from about 5500° K. to about 6500° K.

18. The illumination source of claim 17, wherein the white light has a color rendering index ranging from about 60 to about 99.

19. The illumination source of claim 1, wherein the illumination source produces a white light having a color temperature ranging from about 3000° K. to about 5500° K.

20. The illumination source of claim 19, wherein the white light has a color rendering index of at least 60.

21. The illumination source of claim 1, further comprising circuit elements for controlling electrical power to each of the plurality of OLED devices.

* * * * *